(12) United States Patent
Okada et al.

(10) Patent No.: US 6,870,583 B2
(45) Date of Patent: Mar. 22, 2005

(54) CONDUCTIVE LIQUID CRYSTAL DEVICE AND ORGANIC ELECTROLUMINESCENCE DEVICE

(75) Inventors: Shinjiro Okada, Kanagawa-ken (JP); Akira Tsuboyama, Kanagawa-ken (JP); Takao Takiguchi, Tokyo (JP); Takashi Moriyama, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 29 days.

(21) Appl. No.: 09/825,991

(22) Filed: Apr. 5, 2001

(65) Prior Publication Data

US 2002/0005926 A1 Jan. 17, 2002

(30) Foreign Application Priority Data

Apr. 7, 2000 (JP) ........................................ 2000-106380

(51) Int. Cl.[7] .......................... G02F 1/13; G02F 1/135; G02F 1/1335; G02F 1/1337
(52) U.S. Cl. ............................ 349/69; 349/2; 349/25; 349/129
(58) Field of Search ..................... 349/2, 25, 69, 349/129, 123

(56) References Cited

U.S. PATENT DOCUMENTS

| | | | |
|---|---|---|---|
| 5,115,329 A | * 5/1992 | Ikarashi et al. | 259/50 |
| 5,612,802 A | 3/1997 | Okada et al. | 349/129 |
| 5,654,784 A | * 8/1997 | Yasuda et al. | 349/172 |
| 5,661,532 A | 8/1997 | Okada et al. | 349/135 |
| 5,684,613 A | 11/1997 | Taniguchi et al. | 359/81 |
| 5,719,651 A | 2/1998 | Okada et al. | 349/85 |
| 5,805,129 A | 9/1998 | Inaba et al. | 345/97 |
| 5,932,136 A | 8/1999 | Terada et al. | 252/299.1 |
| 6,221,444 B1 | 4/2001 | Okada et al. | 428/1.25 |

FOREIGN PATENT DOCUMENTS

| | | |
|---|---|---|
| EP | 1 083 613 | 3/2001 |
| EP | 1 089 596 | 4/2001 |

OTHER PUBLICATIONS

Junichi Hanna (Applied Physics), vol. 68, No. 1, pp. 26–32.
Adam, et al., "Fast Photoconduction in the Highly Ordered Columnar Phase . . . ", Natur, vol. 371, No. 8 (Sep. 1994), pp. 141–143.
Stapff, et al., "Mutlilayer Light Emitting Diodes Based on a Columnar Discotics", Preliminary Communication (1997), pp. 613–617.
Lüssem, et al., "Liquid Crystalline Materials For Light-emitting Diodes", Polymers for Advanced Technologies, vol. 9 (1998), pp. 443–460.
Christ, et al., "Columnar Discotics for Light Emitting Diodes", Advanced Materials, vol. 9, No. 1 (1997), pp. 48–52.
Tang, et al., "Organic Electroluminiscent Diodes", Applied Physics Letter, vol. 51, No. 12 (1987), pp. 913–915.

* cited by examiner

Primary Examiner—Tarifur R. Chowdhury
Assistant Examiner—Hoan C. Nguyen
(74) Attorney, Agent, or Firm—Fitzpatrick, Cella, Harper & Scinto

(57) ABSTRACT

A conductive liquid crystal device capable of exhibiting luminescence of different luminances at an identical drive voltage, thus useful as an EL device having a memory chacteristic, is provided. The conductive liquid crystal device is formed by a pair of oppositely disposed electrodes and a liquid crystalline organic layer disposed between the electrodes, wherein the liquid crystalline organic layer has plural regions having different electroconductivities.

3 Claims, 2 Drawing Sheets

CONDUCTIVE LIQUID CRYSTAL DEVICE AND ORGANIC ELECTROLUMINESCENCE DEVICE

BACKGROUND OF THE INVENTION

The present invention relates to an electroconductive liquid crystal device, particularly a conductive liquid crystal device useful as an organic electroluminescence device (hereinafter, the term "electroluminescence" is sometimes abbreviated as "EL" according to common usage in the field).

As for the organic EL device, carrier injection-type EL devices utilizing organic solids, such as anthracene single crystal, were studied in detail in the 1960s. These devices were of a single layer-type, but thereafter Tang, et al. proposed a lamination-type organic EL device comprising a luminescence layer and a hole transporting layer between a hole injecting electrode and an electron injecting electrode. The luminescence mechanism in these injection-type EL devices commonly includes stages of (1) electron injection from a cathode and hole injection from an anode, (2) movement of electrons and holes within a solid, (3) recombination of electrons and holes, and (4) luminescence from the resultant single term excitons.

A representative example of the lamination-type EL device may have a structure including an ITO film as a cathode formed on a glass substrate, a ca. 50 nm-thick layer formed thereon of TPD (N,N'-diphenyl-N,N'-di(3-methylphenyl)-1,1'-biphenyl-4,4'-diamine), a ca. 50 nm-thick layer thereon of Alq$^3$(tris(8-quinolinolato) aluminum), and further a vacuum deposition layer of Al-Li alloy as a cathode. By setting the work function of the ITO used as the anode at 4.4–5.0 eV, the hole injection to TPD is made easier, and the cathode is composed of a metal which has as small a work function as possible and also is stable. Examples of the cathode metal may include Al-Li alloy as mentioned above and also Mg-Ag alloy. By the above organization, green luminescence may be obtained by applying a DC voltage of 5–10 volts.

An example using a conductive liquid crystal as a carrier transporting layer is also known. For example, D. Adam, et al. (Nature, vol. 371, p. 141-) have reported that a long chain triphenylene compound as a discotic liquid crystal material exhibited a mobility of $10^{-3}$–$10^{-2}$ cm$^2$/V.sec in its liquid crystal phase (Dh phase) and a mobility of $10^{-1}$ cm$^2$/V.sec in its mesophase (an intermediate phase, not a liquid crystal phase). Also, as for a bar-shaped liquid crystal, Junichi Hanna (Ohyou Butsuri) (Appl. Phys. vol. 68, no. 1, p. 26-) has reported that a phenylnaphthalene compound exhibited a mobility of $10^{-3}$ cm$^2$/V.sec or higher in its smectic B phase.

As a trial for using such a liquid crystal for electroluminescence, Ingah Stapff, et al. (Liquid Crystals, vol. 23, no. 4, pp. 613–617) have reported an organic EL device using a triphenylene-type discotic liquid crystal. Other reports are found in POLYMERS FOR ADVANCED TECHNOLOGIES, vol. 9, pp. 463–460 (1998), and ADVANCED MATERIALS, vol. 9, no. 1, p. 48-(1997).

Conventional organic EL devices have involved several problems attributable to the use of a low molecular weight compound in a crystal state. A first problem is that the efficiency of injection of electrons or holes from electrodes of ITO, etc., to the organic layers is low. This is due to a minute grain boundary in a crystal state of organic molecules which functions as a carrier conduction barrier. Accordingly, organic molecules in an amorphous state are generally used, though lower carrier injection efficiency results. This, however, is a major reason why an organic EL device cannot ensure a large current.

An organic material used in an organic EL device has an electronic structure providing a large energy gap of ca. 3 eV or larger, thermal excitation-type free electrons are not present in a conduction band, and a drive current (spatial charge restriction current) is principally supplied by injected carriers from the electrodes, so that a low carrier injection efficiency from the electrodes has been a serious problem. As the injection efficiency is low, a large voltage has to be applied in order to ensure a drive current, and the device layer thickness has to be lowered. These factors have caused difficulties, such as a short circuit between the electrodes and an increase in capacitive load.

As a second problem, an organic EL device is liable to be affected by invasive moisture which causes the deterioration of luminescence performance and drive performance, and thus poor durability. In an ordinary organic EL device, the organic layers are disposed in lamination, and then the cathode is formed thereon by vapor deposition of a metal film. In this instance, a metal species having a small work function suitable for the cathode is susceptible to oxidation and has a low durability. Even when forming a protective film thereon by sputtering, the organic layers are liable to be degraded if the forming temperature is high (with an ordinary limit of 100° C.), and the destruction of the device structure due to the film stress is also problematic.

On the other hand, as a problem accompanying the use of a conducive liquid crystal to constitute a carrier transporting layer, it is difficult to align a high order liquid crystal layer. As a high order conductivity can be attained by a regular stacking of π-electron conjugated planes of liquid crystal molecules, the degree of alignment thereof directly affects the conductivity of the resultant conductive liquid crystal layer. In the case of a poor alignment characteristic, trap sites for conduction of electrons and holes can be formed in the liquid crystal layer, so that electroconductivity can be lost completely in some cases.

SUMMARY OF THE INVENTION

A generic object of the present invention is to provide an improvement to the above-mentioned state of the art.

A more specific object of the present invention is to provide a conductive liquid crystal device including a conductive liquid crystal layer having locally different regions by partially or entirely controlling the alignment state of a conductive liquid crystalline organic layer formed on an electrode.

Another object of the present invention is to provide a conductive liquid crystal device wherein such a conductive liquid crystal layer is provided with locally different conductivities and a memory characteristic, thereby causing luminescence exhibiting different luminances at an identical drive voltage.

According to another aspect of the present invention, there is provided an organic electroluminescence device comprising: a conductive liquid crystal device which includes a pair of oppositely disposed electrodes and a liquid crystalline organic layer disposed between the electrodes, wherein the organic layer has plural regions having mutually different alignment states resulting in different luminances of luminescence from the device.

The present invention further provides an organic electroluminescence device comprising: a conductive liquid crystal device which includes a pair of oppositely disposed electrodes and at least two organic layers disposed between the electrodes, wherein said at least two organic layers include at least one liquid crystalline organic layer having plural regions of different electroconductivities resulting in different luminances of luminescence from the device.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
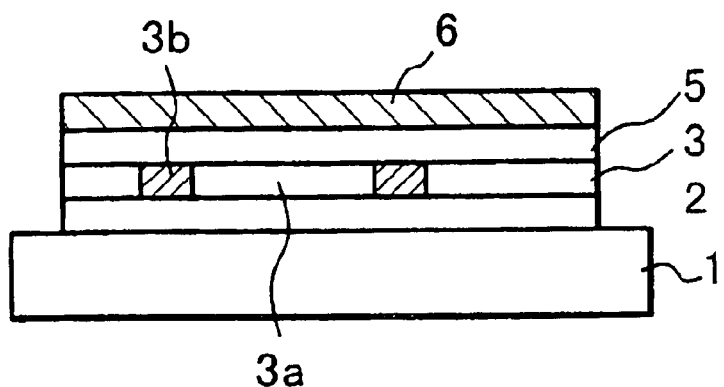
FIG. 1 is a schematic sectional view of an embodiment of the conductive liquid crystal device according to the invention.

According to an embodiment, the conductive liquid crystal device of the present invention may be produced by forming a conductive liquid crystalline organic layer on an electrode and controlling an alignment state of the conductive liquid crystalline organic layer locally or entirely to form regions of mutually different electroconductivities, leading to different luminances of luminescence when used as an organic EL device.

A high electric field on the order of 10 volts/100 nm has been required to drive an organic EL device due to (1) low carrier mobility (holes and electrons) through organic layers and (2) low carrier injection efficiency into the organic layers from the electrodes. Organic materials used in organic EL devices have a broad band gap of ca. 3.0 eV, so that thermal excitation-type free electrons are not present in a conduction band (LUMO: Lowest Unoccupied Molecular Orbital), and drive current is principally supplied by a tunnel current injected from the electrodes. The injection efficiency of the current is known to be remarkably affected not only by the work functions of the electrodes and the level gap between LUMO and HOMO (Highest Occupied Molecular Orbital) of the organic materials, but also by the molecular alignment and structure of the organic materials. However, in order to attain a sufficient drive current using ordinary organic compounds (such as TPD, α-NPD (bis[N-(1-naphthyl)-N-phenyl]benzidine), TAZ-01 (3-(4-biphenyl)-4-phenyl-5-(4-tert-butylphenyl)-1,2,4-triazole), Alq3, etc.) in ordinary EL devices, it has been necessary to apply a high electric field (on the order of 10 V/100 nm) across the organic layer-electrode boundaries. Further, as the mobility of the organic materials is on the order of $10^{-6}$–$10^{-3}$ cm$^2$/V.sec, it is also necessary to apply a high electric field in order to ensure a drive current. Some improvement with regard to the above problem has been found using a conductive liquid crystal for constituting a liquid crystalline charge injection layer as proposed by our research group (EP-A 1083613 and EP-A 1089596).

The use of a conductive liquid crystal for constituting a charge injection layer is effective because of the following reasons and functions.

(1) Some conductive liquid crystalline materials have a mobility exceeding $10^{-2}$ cm$_2$/V.sec (D. Adam, et al., Nature, vol. 371, p. 141-).

(2) A conductive liquid crystal causes a phase transition at a higher temperature to assume a lower order liquid crystal phase, such as nematic phase or discotic disordered phase, thereby showing a good alignment characteristic to cause alignment of liquid crystal molecules over an electrode surface.

(3) Especially, a discotic liquid crystal generally has a structure including a core of, e.g., triphenylene, and side chains attached to the periphery of the core for developing mesomorphism (liquid crystal property). The side chains generally exhibit poor wettability with a metal or metal oxide (such as ITO) substrate, so that in the liquid crystal state of the discotic liquid crystal, the core is aligned parallel to the electrode surface, whereby the π-electron resonance plane of the core is aligned parallel to the electrode surface, thereby facilitating carrier transfer with the electrode. Accordingly, it is possible to provide a higher injection efficiency than an ordinary organic compound in an amorphous state.

This effect can also be expected for an ordinary bar-shaped liquid crystal having a molecular structure including a phenyl group or a naphthalene group having a π-electron resonance plane.

(4) The formation of a conductive liquid crystal layer as a carrier transporting layer by vacuum deposition is particularly effective. A liquid crystal film layer formed by vacuum deposition has a coarse molecular packing state; the realignment thereof by heating is very easy. This is particularly true with a liquid crystal film formed by vacuum deposition on a substrate at a temperature close to or below Tg (glass transition temperature) of the liquid crystal giving a stably coarse film structure.

(5) A high order liquid crystal phase having a higher degree of order has a low fluidity; the alignment thereof in the high order liquid crystal phase per se is difficult, whereas the alignment characteristic thereof can be improved if the liquid crystal layer is sandwiched between films having a power of aligning π-electron conjugated planes parallel thereto. Realignment by heating to the isotropic phase is not desirable for device formation sometimes because the liquid crystal material in a liquid phase has a strong dissolving power with respect to other organic materials; however, the dissolution problem is not encountered at a boundary with a metal film. In the case of sandwiching a liquid crystal with metal films, one of them is required to allow light transmission. For example, in the case of using a gold film, the film may be formed as an island-like uneven film, but the alignment thereby of a liquid crystal is improved as compared to that in the absence of such a gold film.

(6) A molecule exhibiting mesomorphism can reorganize molecular disposition at the electrode surface by realigning post treatment. This can facilitate the injection efficiency. The post treatment can exhibit a large effect even when it is performed by heating only to a liquid crystal phase temperature if it provides a lower viscosity. The heating to the isotropic temperature, while it is effective for realignment, has to be suppressed to a temperature below the Tg of other organic materials used therewith.

(7) At a boundary of a luminescence layer with a liquid crystal layer or an intermediate metal layer, it is effective to insert a protective layer comprising a material having a carrier transporting function of the same type.

In the present invention, such a conductive liquid crystal layer is formed while noting the above points, so as to provide regions of different electroconductivities by locally changing the alignment state thereof.

The local alignment state change is principally performed by local heating of the conductive liquid crystalline organic layer. This can alternatively be effected by a surface treatment of electrode surfaces, such as local surface roughening at regions for not aligning the liquid crystal on the electrode surface.

The conductive liquid crystal device structure including a conductive liquid crystal layer having a locally different conductivity can be effectively used to constitute an organic EL device as described in detail below but also to constitute other functional devices, such as a photosensor, a photoconductor (electrophotographic photosensitive member), an organic semiconductor device (such as an organic TFT), a temperature sensor, and a space modulation device.

FIG. 1 is a schematic sectional view of an embodiment of the conductive liquid crystal device according to the present invention. Referring to FIG. 1, the conductive liquid crystal device includes a transparent substrate 1, a transparent electrode (anode) 2, a liquid crystalline organic layer 3, a luminescence layer 5 and a metal electrode (cathode) 6 disposed, in this order, on the substrate 1. The liquid crystalline organic layer 3 is provided with plural regions having mutually different electroconductivities including non-aligned liquid crystal regions 3a having a lower conductivity and aligned liquid crystal regions 3b having a higher conductivity.

The liquid crystalline organic layer 3 comprises a liquid crystalline or mesomorphic compound having a liquid crystal phase at some temperature, inclusive of low molecular weight (non-polymeric) conductive liquid crystals and polymeric conductive liquid crystals. The conductive liquid crystal may suitably have a π-electron resonance structure, which is generally given by an aromatic ring. Examples thereof may include: triphenylene ring, naphthalene ring and benzene ring, as representative, and also pyridine ring, pyrimidine ring, pyridazine ring, pyrazine ring, tropone ring, azulene ring, benzofuran ring, indole ring, indazole ring, benzothiazole ring, benzoxazole ring, benzimidazole ring, quinoline ring, isoquinoline ring, quinazoline ring, quinoxaline ring, phenanthrene ring and anthracene ring.

The conductive liquid crystal used in the present invention may preferably comprise a discotic liquid crystal or a smectic liquid crystal. A discotic liquid crystal may generally have a core structure which may be given by an aromatic ring as mentioned above for the π-electron resonance structure, as represented by triphenylene ring (or skeleton). Further examples thereof may include truxene skeleton, metal-phthalocyanine skeleton, phthalocyanine skeleton, dibenzopyrene skeleton, metal-naphthalocyanine skeleton, dibenzopyrene skeleton, and hexabenzocoronene skeleton.

As for the electrode materials used in the present invention, examples of materials which may constitute the anode 2 include: indium oxide, tin oxide, $Cd_2SnO_4$, zinc oxide, copper iodide, gold and platinum, in addition to ITO used in examples described hereinafter. Examples of materials which may constitute the cathode 6 include: alkali metals, alkaline earth metals and alloys of these, inclusive of sodium, potassium, magnesium, lithium, sodium-potassium alloy, magnesium-indium alloy, magnesium-silver alloy, aluminum, aluminum-lithium alloy, aluminum-copper alloy, aluminum-copper-silicon alloy.

Further, examples of materials for the luminescence layer 5 include: in addition to Alq3, BeBq (bis(benzoquinolinolato)beryllium), DTVB2 (4,4-bis(2,2-di-p-tolylvinyl)biphenyl), Eu(DBM)3(Phen) (tris(1,3-diphenyl-1,3-propanediono)-monophenanthroline)Eu(III)), and further, diphenyl-ethylene derivatives, triphenylamine derivatives, diaminocarbazole derivatives, bisstyryl derivatives, benzothiazole derivatives, benzoxazole derivatives, aromatic diamine derivatives, quinacridone compounds, perylene compounds, oxadiazole derivatives, coumarin compounds, anthraquinone derivatives, distyrylarylene derivatives (DPVBi), and oligothiophene derivatives (BMA-3T).

Further, as mentioned above, a protective layer can be inserted adjacent to the liquid crystalline organic layer 3. The protective layer may preferably comprise a material having a large volume so as to exhibit little diffusivity into liquid crystalline materials used in the liquid crystalline organic layer 3. It is further preferred that the protective layer material does not have a liquid crystal phase of an order equivalent to or lower than that of a disordered phase at an operation—temperature, and more preferably is a non-liquid crystal material. Examples thereof may include:

α-NPD: bis[N-1-(naphthyl)N-phenyl]benzidine,

1-TANTA: 4,4',4"-tris(1-naphthylphenylamino)triphenylamine,

2-TANTA: 4,4',4"-tris(2-naphthylphenylamino)-triphenylamine,

TCTA: 4,4',4"-tris(N-carbazoyl)triphenylamine, p-DPA-TDAB: 1,3,5-tris[N-(4-diphenylaminophenyl)-phenylamino]benzene, TDAB: 1,3,5-tris(diphenylamino)benzene, DTATA: 4,4',4"-tris(diphenylamino)triphenylamine, TDAPB: 1,3,5-tris[(diphenylamino)phenyl]benzene.

EXAMPLES

Hereinbelow, the present invention will be described more specifically based on examples.

Example 1

Figure 2A:
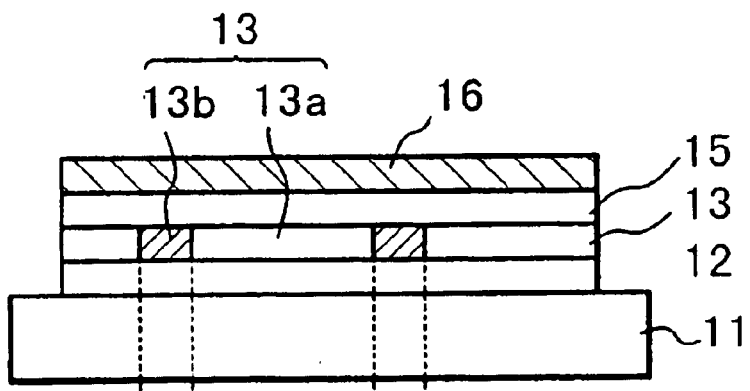
FIG. 2A is a schematic sectional view of an organic EL device according to Example 1 of the invention.
Figure 2B:
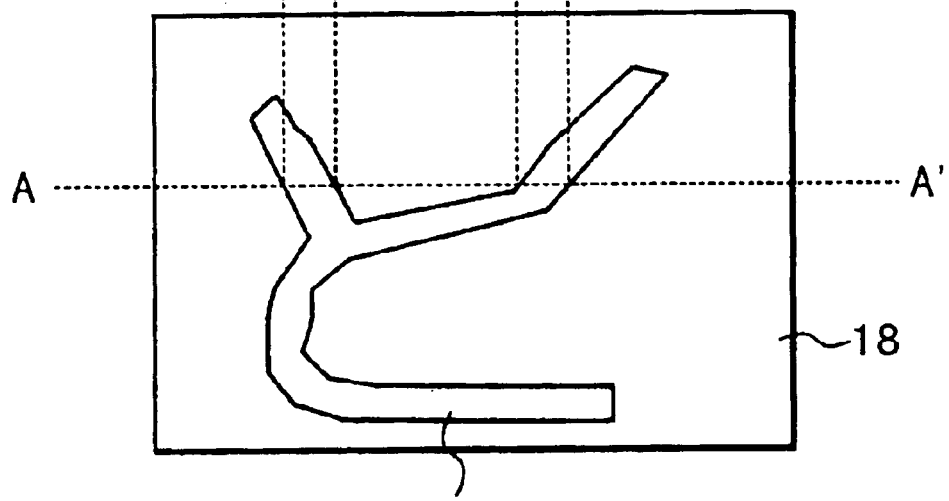
FIG. 2B is a corresponding bottom plan view.

An organic EL device having a sectional structure as shown in FIG. 2A (which is substantially identical to FIG. 1), which is a sectional view taken along a line A–A' in FIG. 2B, a corresponding bottom plan view, was prepared in the following manner.

More specifically, on a glass substrate 11 held at 200° C., a 70 nm-thick ITO film was formed as a hole-injecting anode 12 by sputtering using a target of In 90 wt. % and Sn 10 wt. % while flowing Ar gas at 200 sccm and $O_2$ gas at 3 sccm. The ITO film showed a work function of ca. 4.35 eV after the sputtering, but was then exposed to ultraviolet rays from a low-pressure mercury lamp in order to achieve an elevated work function of ca. 4.6 eV.

The above-treated glass substrate 11 having an ITO film 12 was placed in a vacuum chamber held at a pressure below $2.67 \times 10^{-3}$ Pa ($2 \times 10^{-5}$ torr), and a ca. 35 nm-thick layer of HHOT (hexabis(hexyloxy)-triphenylene) of a formula shown below was formed as a conductive liquid crystal layer 13 on the ITO film 12 by vacuum deposition at a rate of ca. 0.1 nm/sec at a pressure of $1.33 \times 10^{-3}$ Pa ($1 \times 10^{-5}$ torr) according to the resistance heating vacuum deposition method. HHOT exhibited a mobility of $1 \times 10^{-3}$ cm$^2$/V.sec at ca. 70° C. or below according to the time-of-flight method. Incidentally, HHOT is a discotic liquid crystal causing a transition from crystal to discotic disordered phase at 65° C. and a transition to isotropic phase at 98° C.

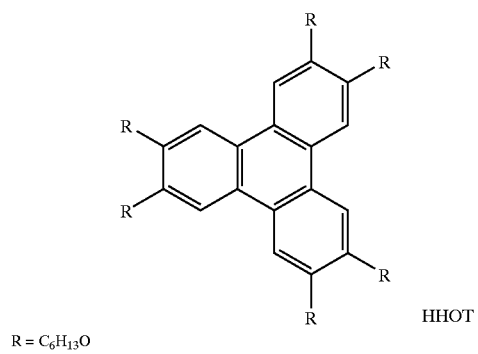

R = C₆H₁₃O   HHOT

Then, on the HHOT layer 13, a luminescence layer 15 of Alq₃, represented by a structural formula shown below was formed in a thickness of 60 nm by vacuum deposition at a rate of ca. 0.1 nm/sec under a pressure of 133×10⁻³ Pa (1×10⁻⁵ torr).

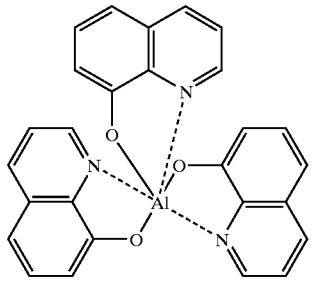

Then, the Alq₃ layer 15 was further coated with a cathode metal 16 comprising a 50 nm-thick layer of Al—Li alloy (Li content=1.8 wt. %) and a 150 nm thick Al layer, respectively formed by vacuum deposition to form a device structure roughly as shown in FIG. 2A.

In this state, all the organic layers 13 and 15 were in an amorphous (non-aligned) state. In this state, the liquid crystal layer 13 was locally irradiated with a GaAlAs laser beam (beam diameter=ca. 20 μm, 10 mW) and cooled by standing to produce locally aligned portions 13b showing a higher conductivity than non-irradiated, non-aligned regions 13a.

As a result, an organic EL device having a sectional structure as shown in FIG. 2A was obtained.

The organic EL device was subjected to voltage application under an electric field of 12 volts/100 nm. As a result, the device exhibited luminescence with different luminescences at laser-irradiated parts 13b and non-irradiated parts 13a as shown in Table 1 below and exhibited a display state as shown in FIG. 2B giving a sufficient contrast between the irradiated luminescent parts 17 and non-irradiated non-luminescent parts 18.

TABLE 1

|  | Current (mA/cm²) | Luminance (cd/m²) |
|---|---|---|
| Laser-irradiated aligned parts | 3.593 | 120 |
| Non-irradiated non-aligned parts | 0.05 | 1.5 |

Example 2

Figure 3:
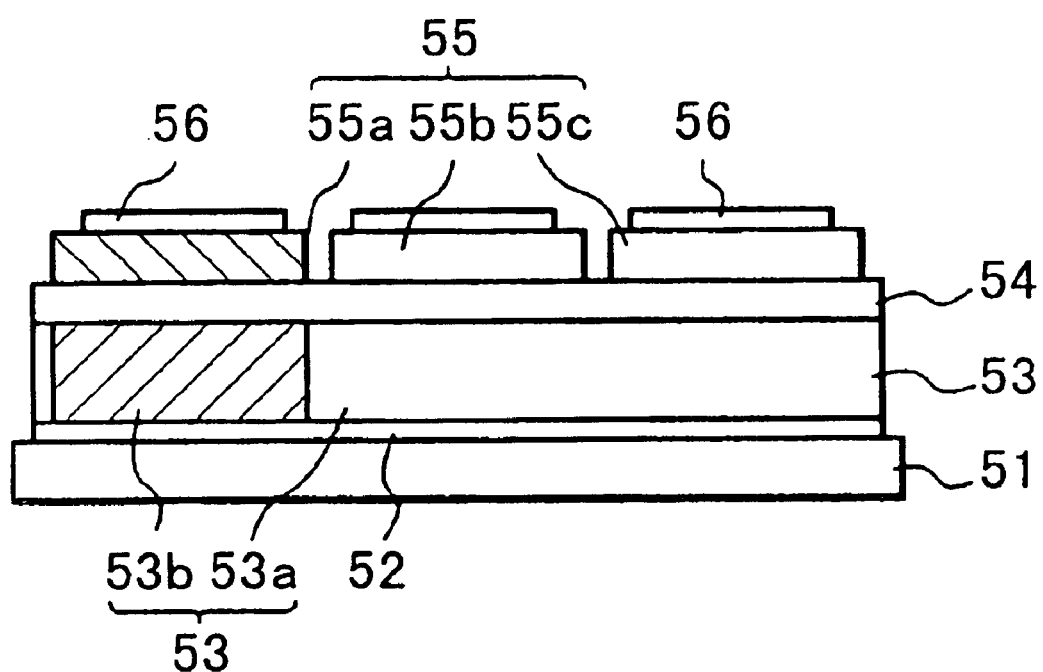
FIG. 3 is a schematic sectional view of an organic EL device according to Example 2 of the invention.

An organic EL device having a sectional structure as shown in FIG. 3 including a pixel structure and a conductive liquid crystal layer 53 having a higher conductivity region 53b corresponding to a selected pixel formed by high voltage application was prepared in the following manner.

A glass substrate 51 coated with a 70 nm-thick ITO layer (anode) 52 and a ca. 35 nm-thick HHOT layer (conductive liquid crystal layer) 53 was prepared in the same manner as in Example 1.

Then, on the HHOT layer 53, a protective layer 54 of α-NPD, represented by a structural formula shown below, was formed in a thickness of 60 nm by vacuum deposition at a rate of ca. 0.1 nm/sec under a pressure of 1.33×10⁻³ Pa.

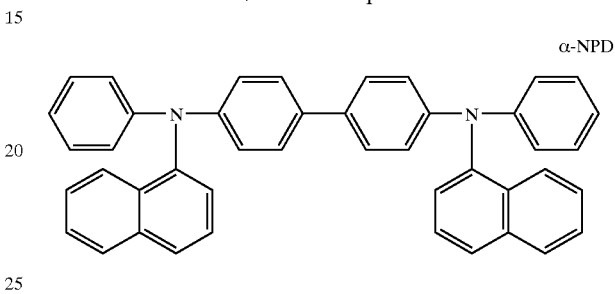

α-NPD

Luminescence organic layer segments 55a–55c exhibiting different luminescent wavelengths were respectively formed in a thickness of 50 nm on the protective layer 54 by vacuum deposition through a mask with a pressure of 1×10⁻⁵ torr and a deposition rate of ca. 0.1 nm/sec. The organic layers 55a–55c were respectively formed of Alq3 alone, Alq3 doped with 5 wt. % of perylene for shifting the luminescence wavelength to a shorter wavelength side, and Alq3 doped with 5 wt. % of DCM (a styryl dye) for shifting to a longer wavelength side. The structural formulae for the above-mentioned perylene and DCM are shown below.

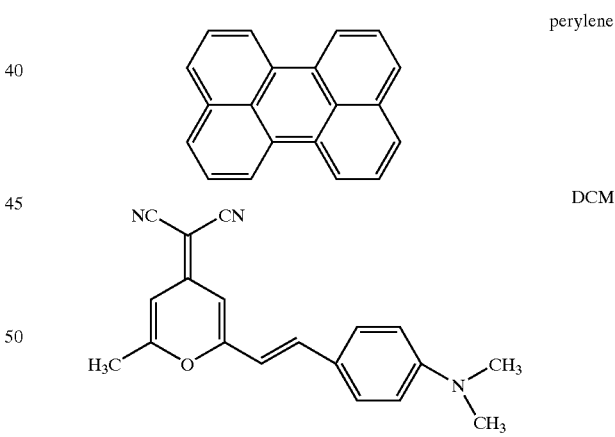

perylene

DCM

The above-prepared organic layers 55a–55c were respectively coated with cathode metals 56, each comprising a 50 nm-thick layer of Al—Li alloy (Li content=1.8 wt. %) and a 150 nm-thick Al layer, respectively formed by vacuum deposition, to obtain an organic EL device having a structure as shown in FIG. 3.

The above-prepared device was confirmed to exhibit luminescence of respective colors at segments 55a–55c at an increased luminance at an increased current when maintained at 75° C.

In this example, only a selected pixel portion of the organic layers including a luminescence segment (55a in FIG. 3) was supplied with a high electric field of 15 volts/100 nm for 3 min at 30° C.; the other segments (55b and 55c in FIG. 3) were not subjected to the high voltage application treatment. Thereafter, all the segments 55a–55c were supplied with a drive electric field of 5 volts/100 nm at 30° C. As a result, the segment 55c subjected to the high voltage application treatment exhibited a selectively high luminance as shown in Table 2 below.

TABLE 2

|  | Current (mA/cm$^2$) | Luminance (cd/m$^2$) |
| --- | --- | --- |
| High voltage treatment applied (55a, 53b) | 12 | 300 |
| High voltage treatment not applied (55b–55c, 53a) | <0.05 | 0 |

Example 3

An organic EL device having a sectional structure as shown in FIG. 3 (before the formation of a different conductivity region 53b) was prepared in the same manner as in Example 2, except HPOT (hexabis(pentyloxy)triphenylene) of a formula shown below was used instead of HHOT for providing a conductive liquid crystal layer 53.

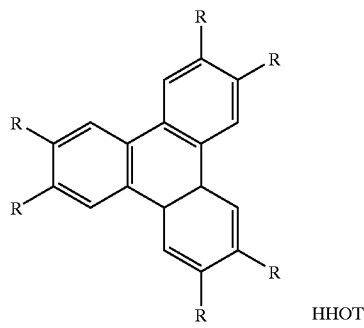

R = C$_5$H$_{11}$O

HHOT

After the above device preparation, a portion of the conductive liquid crystal layer 53 (corresponding to a luminescence segment 55a in FIG. 3) was irradiated with a GaAlAs laser beam (beam diameter=ca. 20 μm, 10 mW), similar to Example 1, to form a different conductivity region (53b shown in FIG. 3).

Thereafter, the device was subjected to the application of an electric field of 12 volts/100 nm, whereby the irradiated part and non-irradiated parts exhibited different luminances as shown in Table 3 below.

TABLE 3

|  | Current (mA/cm$^2$) | Luminance (cd/m$^2$) |
| --- | --- | --- |
| Laser-irradiated aligned parts (55a, 53b) | 11.5 | 500 |

TABLE 3-continued

|  | Current (mA/cm$^2$) | Luminance (cd/m$^2$) |
| --- | --- | --- |
| Non-irradiated non-aligned parts (55b–55c, 53a) | 2.3 | 90 |

The same device exhibited luminance differences at irradiated parts and non-irradiated parts at an electric field of 10 volts/100 nm as shown in Table 4 below.

TABLE 4

|  | Current (mA/cm$^2$) | Luminance (cd/m$^2$) |
| --- | --- | --- |
| Laser-irradiated aligned parts (55a, 53b) | 3.0 | 110 |
| Non-irradiated non-aligned parts (55b–55c, 53a) | 0.4 | 18 |

As described above, according to the present invention, it has become possible to provide an organic EL device having a memory characteristic by including a conductive liquid crystal layer having regions of different conductivities.

Compared with a conventional EL device lacking recordability (memory characteristic) of a written or display state, the EL device of the present invention can exhibit locally different luminances at an identical drive voltage. This characteristic is available not only in a display device, but also in a memory device.

What is claimed is:

1. A conductive liquid crystal device comprising:

a pair of oppositely disposed electrodes, and at least two organic layers including a planar liquid crystalline organic layer and an organic luminescence layer disposed between the electrodes, wherein the planar liquid crystalline organic layer has plural regions which are on at least one of the electrodes and have different electroconductivities, and wherein the organic luminescence layer emits luminescences by receiving charges supplied by the plural regions of the planar liquid crystalline organic layer having different electroconductivities, said different electroconductivities are effected by changing an alignment state of liquid crystal molecules in the planar liquid crystalline organic layer.

2. The device according to claim 1, wherein said plural regions have different alignment states of liquid crystal molecules and said different alignment states have been formed by laser light irradiation of the planar liquid crystalline organic layer.

3. The device according to claim 1, wherein said plural regions have different alignment states of liquid crystal molecules and said different alignments states have been formed by voltage application to the planar liquid crystalline organic layer.

* * * * *

UNITED STATES PATENT AND TRADEMARK OFFICE
CERTIFICATE OF CORRECTION

PATENT NO. : 6,870,583 B2
DATED : March 22, 2005
INVENTOR(S) : Shinjiro Okada et al.

It is certified that error appears in the above-identified patent and that said Letters Patent is hereby corrected as shown below:

<u>Title page,</u>
Item [56], References Cited, OTHER PUBLICATIONS, "Adam, et al." reference, "Natur" should read -- Nature --.

<u>Column 10,</u>
Line 59, "alignments" should read -- alignment --.

Signed and Sealed this

Eleventh Day of April, 2006

JON W. DUDAS
*Director of the United States Patent and Trademark Office*